(12) United States Patent
Jiang et al.

(10) Patent No.: US 11,432,409 B2
(45) Date of Patent: Aug. 30, 2022

(54) LED DISPLAY MODULE

(71) Applicant: UNILUMIN GROUP CO., LTD, Guangdong (CN)

(72) Inventors: Minyu Jiang, Guangdong (CN); Kuang Yang, Guangdong (CN)

(73) Assignee: UNILUMIN GROUP CO., LTD, Shenzhen (CN)

( * ) Notice: Subject to any disclaimer, the term of this patent is extended or adjusted under 35 U.S.C. 154(b) by 402 days.

(21) Appl. No.: 16/746,983

(22) Filed: Jan. 20, 2020

(65) Prior Publication Data
US 2020/0275562 A1 Aug. 27, 2020

(30) Foreign Application Priority Data
Feb. 21, 2019 (CN) .......................... 201920228605.4

(51) Int. Cl.
*H05K 5/00* (2006.01)
*H05K 5/02* (2006.01)
*H01L 25/13* (2006.01)

(52) U.S. Cl.
CPC ........... *H05K 5/0017* (2013.01); *H01L 25/13* (2013.01); *H05K 5/023* (2013.01); *H05K 5/0204* (2013.01); *H05K 5/0213* (2013.01); *H05K 5/0247* (2013.01)

(58) Field of Classification Search
CPC ...... G09F 9/3026; G09F 9/33; G09F 23/0066; G02F 1/13336; G06F 1/1601; G06F 1/1607; H05K 7/1467; H05K 5/0017; H05K 5/0204; H05K 5/0213; H05K 5/023; H05K 5/0247; H01L 25/13
See application file for complete search history.

(56) References Cited

U.S. PATENT DOCUMENTS

| 9,918,394 | B2* | 3/2018 | Nakano | H05K 7/1467 |
| 2012/0218753 | A1* | 8/2012 | Jotter | G09F 9/33 361/679.01 |
| 2013/0271973 | A1* | 10/2013 | Rycyna, III | G09F 9/33 362/249.02 |
| 2014/0247612 | A1* | 9/2014 | Hochman | G09F 9/3026 362/427 |
| 2018/0031919 | A1* | 2/2018 | Ryu | H01F 7/0221 |

FOREIGN PATENT DOCUMENTS

| CN | 202142252 U | 2/2012 |
| CN | 202838850 U | 3/2013 |
| CN | 103065559 B | 1/2015 |
| CN | 204884455 U | 12/2015 |
| CN | 106782120 A | * 5/2017 |

OTHER PUBLICATIONS

Communication pursuant to Rules 70(2) and 70a(2) EPC and reference to Rule 39(1) EPC in counterpart European application No. 20155550.5, dated Aug. 31, 2020.

* cited by examiner

*Primary Examiner* — Abhishek M Rathod

(57) ABSTRACT

Disclosed is a LED display module, which includes a rear plate; at least one clamping strip including a plurality of clamping slots; and a plurality of light bars limited by the plurality of clamping slots. The clamping strip includes a handle, and the rear plate includes at least one through hole configured for the handle to pass through. The LED display module provided by the present application includes at least one handle which is convenient for the user to carry and maintain. The structure is stable, and the LED display module is not easy to be damaged during transportation.

20 Claims, 4 Drawing Sheets

LED DISPLAY MODULE

FIELD

The present application relates to the technical field of LED display screens, in particular to a LED display module.

BACKGROUND

The existing LED display module includes a rear plate and a plurality of light bars installed on the rear plate. A clamping strip with a plurality of clamping slots for limiting the light bars is generally provided on the rear plate to ensure the distance between adjacent light bars, and the clamping slots are provided corresponding to the light bars one by one.

While there's no point of application of force for the user to assemble the existing LED display module, and it is inconvenient for the user to carry it.

SUMMARY

The object of the present application is to provide a LED display module which is easy to carry.

In order to achieve the above object, the present application provides a LED display module, which includes a rear plate; at least one clamping strip including a plurality of clamping slots; and a plurality of light bars limited by the plurality of clamping slots. The clamping strip includes a handle, and the rear plate includes at least one through hole configured for the handle to pass through.

Further, the handle and the clamping strip are integrally formed.

Further, the rear plate includes at least one ventilation hole.

Further, at least one of the light bars is abutted against the rear plate, and at least one of the light bars includes a first slot configured to avoid the clamping strip.

Further, one side of at least one of the clamping slots includes a second slot.

Further, the LED display module further includes an adapter board fixed on the rear plate, and one end of each light bar is fixed and electrically connected to the adapter board. The adapter board includes at least one interface. The rear plate includes at least one slot configured to expose the at least one interface.

Further, the LED display module further includes a side fixing board, and the other end of each light bar is fixed on the side fixing board.

Further, the rear plate and the adapter board both include at least one positioning hole, and the at least one positioning hole defined at the rear plate are aligned with the at least one positioning hole defined at the adapter board.

Further, the LED display module further includes a front plate fixedly connected with the rear plate. The light bars and the clamping strip are located between the front plate and the rear plate. A lateral side of the clamping strip away from the rear plate is abutted against the front plate. A gap is defined between each light bar and the front plate.

Further, a side of the rear plate adjacent to the front plate includes a plurality of positioning columns, and the plurality of positioning columns are abutted against the front plate.

Further, a number of the clamping strip is two; each clamping strip includes the handle; and the rear plate includes two through holes configured for the handle to pass through.

Further, the handle and each clamping strip are integrally formed.

Further, at least one of the light bars includes two first slots configured to avoid the two clamping strips respectively.

Further, the LED display module further includes a front plate fixedly connected with the rear plate. The light bars and the two clamping strips are located between the front plate and the rear plate. Lateral sides of the two clamping strips away from the rear plate are abutted against the front plate.

Further, the two clamping strips both include at least one weight reduction slot.

Further, a number of the clamping strip is two; and each clamping strip includes the plurality of clamping slots configured to limit the plurality of light bars.

Further, the handle and each clamping strip are integrally formed.

Further, at least one of the light bars includes two first slots configured to avoid the two clamping strips respectively.

Further, the LED display module further includes a front plate fixedly connected with the rear plate. The light bars and the two clamping strips are located between the front plate and the rear plate. Lateral sides of the two clamping strips away from the rear plate are abutted against the front plate.

Further, the two clamping strips both include at least one weight reduction slot.

The beneficial effect of the present application is that the LED display module includes a handle, which is convenient for the user to carry and maintain. The local area of the clamping strip may be able to withstand greater shear forces compared to the rear plate. As a result, the handle connecting with the clamping strip may ensure the structural stability of the LED display module, and the LED display module may be not easily damaged during transportation.

Figure 1:
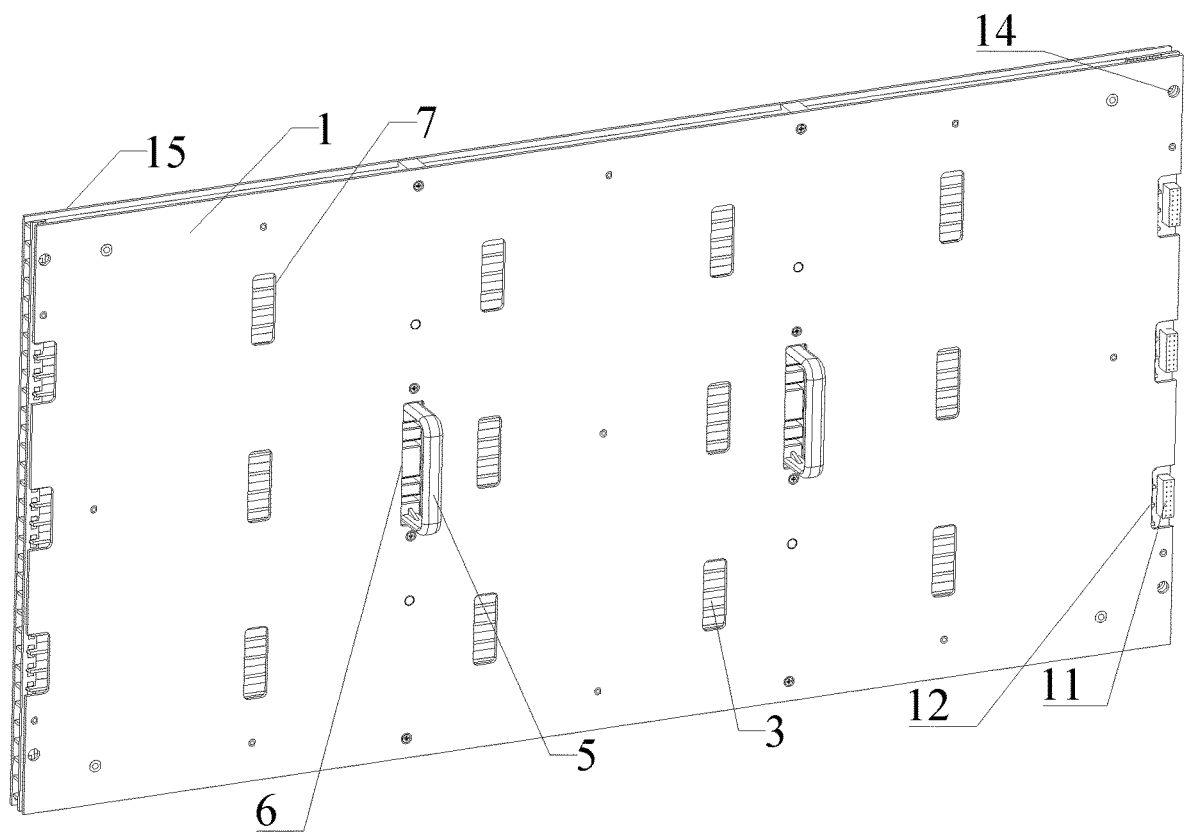
FIG. 1 is a schematic view of an overall structure of a LED display module according to an embodiment of the present application.

Description of reference numerals:

| Reference numeral | Name |
|---|---|
| 1 | Rear plate |
| 2 | Clamping strip |
| 3 | Light bar |
| 4 | Clamping slot |
| 5 | Handle |
| 6 | Through hole |
| 7 | Ventilation hole |
| 8 | First slot |
| 9 | Second slot |
| 10 | Adapter board |
| 11 | Interface |
| 12 | Slot |
| 13 | Side fixing board |
| 14 | Positioning hole |
| 15 | Front plate |
| 16 | Gap |
| 17 | Positioning column |
| 18 | Weight reduction slot |

DETAILED DESCRIPTION OF THE EMBODIMENTS

In order to explain in detail the technical content, the achieved object, and effects of the present application, the following description will be made in conjunction with the embodiments and the accompanying drawings.

The most key idea of the present application is that a handle is provided on a LED display module, which is convenient for user to carry and maintain. The handle is connected with the clamping strip, which may prevent the LED display module from being accidentally damaged during transportation.

Figure 2:
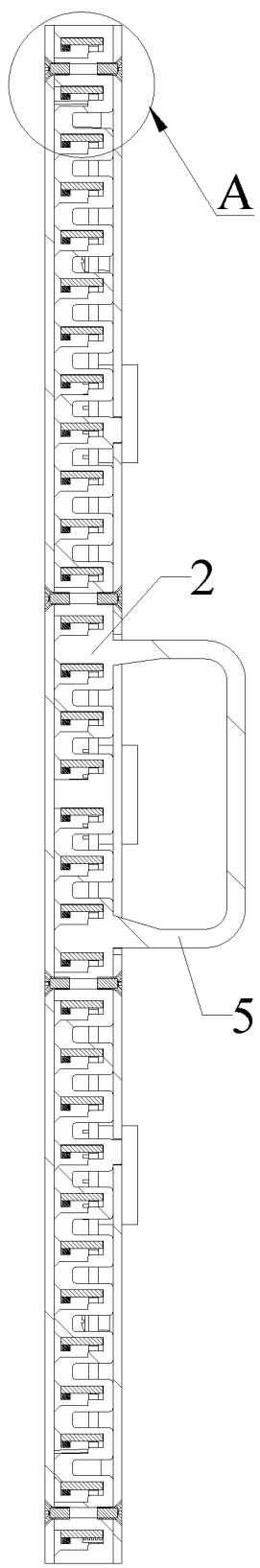
FIG. 2 is a cross-sectional view of the LED display module according to an embodiment of the present application.
Figure 3:
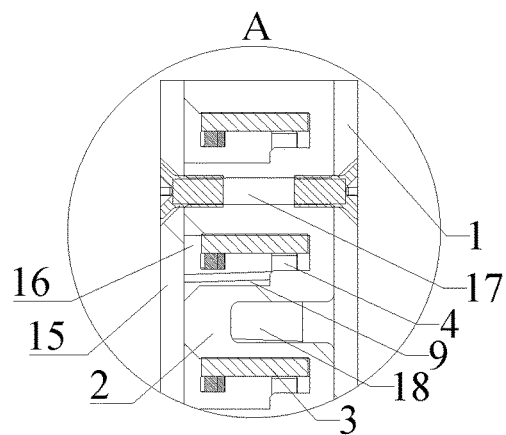
FIG. 3 is an enlarged view of a portion A in FIG. 2.
Figure 4:
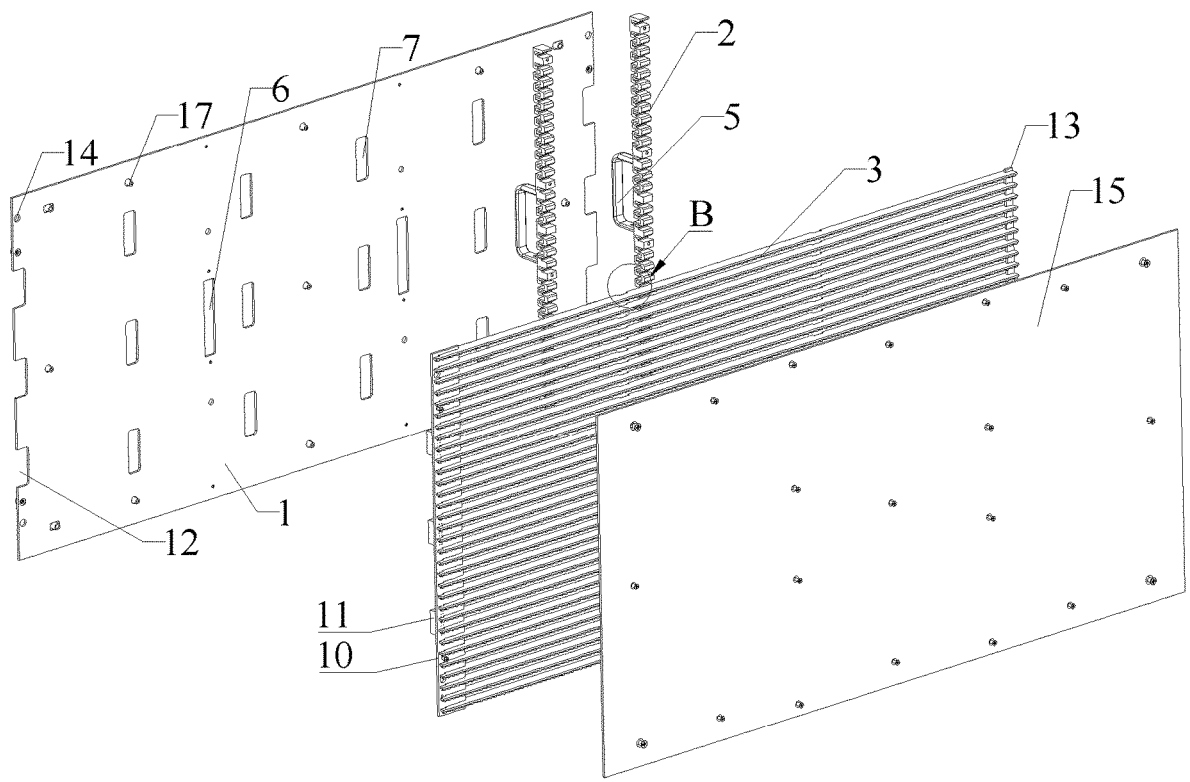
FIG. 4 is an exploded view of the LED display module according to an embodiment of the present application.
Figure 5:
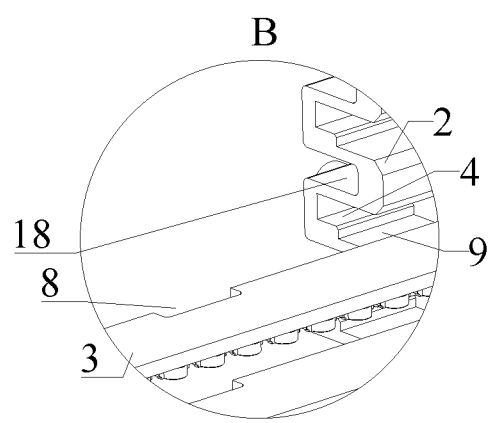
FIG. 5 is an enlarged view of a portion B in FIG. 4.

Referring to FIG. 1 to FIG. 5, a LED display module includes a rear plate 1; at least one clamping strip 2 including a plurality of clamping slots 4; and a plurality of light bars 3 limited by the plurality of clamping slots 4. The clamping strip 2 includes a handle 5, and the rear plate 1 includes at least one through hole 6 configured for the handle 5 to pass through.

As can be seen from the above description, the beneficial effect of the present application is that the LED display module includes a handle 5, which is convenient for the user to carry and maintain. The local area of the clamping strip 2 may be able to withstand greater shear forces compared to the rear plate 1. As a result, the handle b connecting with the clamping strip 2 may ensure the structural stability of the LED display module, and the LED display module may be not easily damaged during transportation.

Further, the handle 5 and the clamping strip 2 are integrally formed.

It can be known from the above description that the handle 5 and the clamping strip 2 are integrally formed, which facilitates processing and reducing manufacturing costs.

Further, the rear plate 1 includes at least one ventilation hole 7.

It can be known from the above description that the ventilation performance of the LED display module may be enhanced by defining at least one ventilation hole 7 on the rear plate.

Further, at least one of the light bars 3 is abutted against the rear plate 1, and at least one of the light bars 3 includes a first slot 8 configured to avoid the clamping strip 2.

It can be known from the above description that the end surface of the light bar 3 is abutted against the rear plate, which facilitates improving the structural stability of the LED display module.

Further, one side of at least one of the clamping slots 4 includes a second slot 9.

It can be known from the above description that the second slot 9 communicating with the clamping slot 4 is configured to provide a space to avoid the components (such as lamp beads) on the light bar 3.

Further, the LED display module further includes an adapter board 10 fixed on the rear plate 1, and one end of each light bar 3 is fixed and electrically connected to the adapter board 10. The adapter board 10 includes at least one interface 11. The rear plate 1 includes at least one slot 12 configured to expose the at least one interface 11.

It can be known from the above description that the LED display module may be in electrical connection and signal connection with the display cabinet through the above interface.

Further, the LED display module further includes a side fixing board 13, and the other end of each light bar 3 is fixed on the side fixing board 13.

It can be known from the above description that the side fixing board 13, the light bar 3 and the adapter board 10 form a fence structure, which facilitates further improving the structural stability of the LED display module.

Further, the rear plate 1 and the adapter board 10 both include at least one positioning hole 14, and the at least one positioning hole 14 defined at the rear plate 1 are aligned with the at least one positioning hole 14 defined at the adapter board 10.

It can be known from the above description that it is convenient to install the LED display module on an external component (such as a display cabinet) by the at least one positioning hole 14, which facilitates user operations and enhancing the user experience.

Further, the LED display module further includes a front plate 15 fixedly connected with the rear plate 1. The light bars 3 and the clamping strip 2 are located between the front plate 15 and the rear plate 1. A lateral side of the clamping strip 2 away from the rear plate 1 is abutted against the front plate 15. A gap 16 is defined between each light bar 3 and the front plate 15.

It can be known from the above description that the structural stability of the LED display module may be further improved by the clamping strip 2 being abutted against the front plate 15. The gap 16 between each light bar 3 and the front plate 15 may provide sufficient protection for the lamp beads on the light bar 3.

Further, a side of the rear plate 1 adjacent to the front plate 15 is provided with a plurality of positioning columns 17, and the plurality of positioning columns 17 are abutted against the front plate 15.

It can be known from the above description that the distance between the front plate 15 and the rear plate 1 may be ensured by the positioning columns 17, so that the front plate 15 may be adequately supported, and the structure of the LED display module may be more stable.

An embodiment of the present application will be described below.

Referring to FIG. 1 to FIG. 5, the first embodiment of the present application is: a LED display module includes a rear plate 1; at least one clamping strip 2 including a plurality of clamping slots 4; and a plurality of light bars 3 limited by the plurality of clamping slots 4 fixed on the rear plate 1 by the clamping strip 2. The clamping strip 2 includes a handle 5, and the rear plate 1 includes at least one through hole 6 configured for the handle 5 to pass through.

In this embodiment, the handle 5 and the clamping strip 2 are integrally formed. Preferably, the handle 5 and the clamping strip 2 are integrally injection-molded. It is easy to understand that it is also feasible to dispose the handle 5 and the clamping strip 2 separately, and the handle 5 and the clamping strip 2 provided separately may be screwed, glued or clamped.

In order to improve the ventilation performance of the LED display module, the rear plate 1 is further provided with at least one ventilation hole 7.

At least one of the light bar 3 is abutted against the rear plate 1. at least one of the light bars 3 is provided with a first slot 8 configured to provide a space to avoid the clamping strip 2, and one side of at least one of the clamping slots 4 is provided with a second slot 9.

Further, the LED display module includes an adapter board 10 fixed on the rear plate 1, and one end of each light bar 3 is fixed and electrically connected to the adapter board 10. At least one interface 11 is provided on the adapter board 10. At least one slot 12 configured to expose the at least one interface 11 is provided on the rear plate 1. The LED display module further includes a side fixing board 13, and the other end of each light bar 3 is fixed on the side fixing board 13. Optionally, the side fixing board 13 is fixedly connected with the rear plate 1. In detail, an engaging structure is respectively provided between the side fixing board 13 and the light bar 3 and between the adapter board 10 and the light bar 3, and the engaging structure includes, but is not limited to, an engaging notch. The engaging structure may make the connection between the light bar 3 and the adapter board 10 and the light bar 3 and the side fixing board 13 more stable.

In order to facilitate the connection of the LED display module with an external component (such as a display cabinet), at least one positioning hole 14 is respectively provided at the rear plate 1 and the adapter board 10, and the at least one positioning hole 14 defined at the rear plate 1 is aligned with the at least one positioning hole 14 defined at the adapter board 10 one by one. In this embodiment, the at least one positioning hole 14 is located at four corners of the rear plate 1. Further, the rear plate 1 is further provided with mounting members connected with the external component. Optionally, the mounting members are mounting screw holes.

The LED display module further includes a front plate 15 fixedly connected with the rear plate 1. The light bars 3 and the clamping strip 2 are located between the front plate 15 and the rear plate 1. A lateral side of the clamping strip 2 away from the rear plate 1 is abutted against the front plate 15. A gap 16 is defined between each light bar 3 and the front plate 15.

In detail, a side of the rear plate 1 adjacent to the front plate 15 is provided with a plurality of positioning columns 17, and the plurality of positioning columns 17 are abutted against the front plate 15. More specifically, one end of the positioning column 17 away from the rear plate 1 is provided with a screw hole, and the front plate 15 is fixed with the positioning column 17 by a screw being engaged with the screw hole so as to be connected and fixed with the rear plate 1. The length of the positioning column 17 is not less than the thickness of the clamping strip 2. Preferably, the length of the positioning column 17 is equal to the thickness of the clamping strip 2. In this way, two opposite lateral sides of the clamping strip 2 are abutted against the front plate 15 and the rear plate 1 respectively, which facilitates enhancing the stability of the structure of the LED display module.

In this embodiment, the clamping strip 2 is provided with a plurality of weight reduction slots 18. The front plate 15 and the rear plate 1 are transparent plates, and the material of the transparent plate may be PC. The clamping strip 2 and the handle 5 are made of transparent materials, and the transparent material may be PC.

In summary, the LED display module provided by the present application includes a handle which is convenient for the user to carry and maintain. The structure is stable, and the LED display module is not easy to be damaged during transportation. The handle and the clamping strip are integrally formed, which facilitates processing and reducing manufacturing costs. The ventilation performance of the LED display module may be enhanced by defining at least one ventilation hole on the rear plate.

The above description is only an embodiment of the present application, and does not therefor limit the scope of the present application. Any equivalent transformation made by using the description and the drawings of the present application, or directly or indirectly applied in the relevant technical field, is similarly included in the scope of the protection of the present application.

What is claimed is:

1. A LED display module, comprising:
   a rear plate;
   at least one clamping strip comprising a plurality of clamping slots; and
   a plurality of light bars limited by the plurality of clamping slots;
   wherein:
      the plurality of light bars are fixed on the rear plate by the plurality of clamping slots:
      the clamping strip comprises a handle; and
      the rear plate comprises at least one through hole configured for the handle to pass through.

2. The LED display module according to claim 1, wherein the handle and the clamping strip are integrally formed.

3. The LED display module according to claim 1, wherein the rear plate further comprising at least one ventilation hole.

4. The LED display module according to claim 1, wherein:
   at least one of the light bars is abutted against the rear plate; and
   at least one of the light bars comprises a first slot configured to avoid the clamping strip.

5. The LED display module according to claim 1, wherein one side of at least one of the clamping slots comprises a second slot.

6. The LED display module according to claim 1, further comprising:
   an adapter board fixed on the rear plate, one end of each light bar being fixed and electrically connected to the adapter board;
   wherein:
      the adapter board comprises at least one interface; and
      the rear plate comprises at least one slot configured to expose the at least one interface.

7. The LED display module according to claim 6, further comprising a side fixing board, the other end of each light bar being fixed on the side fixing board.

8. The LED display module according to claim 6, wherein the rear plate and the adapter board both comprise at least one positioning hole, the at least one positioning hole defined at the rear plate being aligned with the at least one positioning hole defined at the adapter board.

9. The LED display module according to claim 1, further comprising:
   a front plate fixedly connected with the rear plate;
   wherein:
      the light bars and the clamping strip are located between the front plate and the rear plate;
      a lateral side of the clamping strip away from the rear plate is abutted against the front plate; and
      a gap is defined between each light bar and the front plate.

10. The LED display module according to claim 9, wherein a side of the rear plate adjacent to the front plate comprises a plurality of positioning columns, the plurality of positioning columns being abutted against the front plate.

11. The LED display module according to claim 1, wherein:
    a number of the clamping strip is two;
    each clamping strip comprises the handle; and
    the rear plate comprises two through holes configured for the handle to pass through.

12. The LED display module according to claim 11, wherein the handle and each clamping strip are integrally formed.

13. The LED display module according to claim 11, wherein at least one of the light bars comprises two first slots configured to avoid the two clamping strips respectively.

14. The LED display module according to claim 11, further comprising:
a front plate fixedly connected with the rear plate;
wherein:
the light bars and the two clamping strips are located between the front plate and the rear plate; and
lateral sides of the two clamping strips away from the rear plate are abutted against the front plate.

15. The LED display module according to claim 11, wherein the two clamping strips both comprise at least one weight reduction slot.

16. The LED display module according to claim 1, wherein:
a number of the clamping strip is two; and
each clamping strip comprises the plurality of clamping slots configured to limit the plurality of light bars.

17. The LED display module according to claim 16, wherein the handle and each clamping strip are integrally formed.

18. The LED display module according to claim 16, wherein at least one of the light bars comprises two first slots configured to avoid the two clamping strips respectively.

19. The LED display module according to claim 16, further comprising:
a front plate fixedly connected with the rear plate;
wherein:
the light bars and the two clamping strips are located between the front plate and the rear plate; and
lateral sides of the two clamping strips away from the rear plate are abutted against the front plate.

20. The LED display module according to claim 16, wherein the two clamping strips both comprise at least one weight reduction slot.

\* \* \* \* \*